(12) United States Patent
Midtgaard

(10) Patent No.: US 6,577,204 B2
(45) Date of Patent: Jun. 10, 2003

(54) ELECTRONIC CIRCUIT SUPPLIED WITH POWER VIA CURRENT GENERATOR MEANS

(75) Inventor: Jacob Midtgaard, Fredensborg (DK)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 10/012,524

(22) Filed: Dec. 12, 2001

(65) Prior Publication Data

US 2002/0093389 A1 Jul. 18, 2002

(30) Foreign Application Priority Data

Dec. 15, 2000 (GB) .............................. 0030694

(51) Int. Cl.[7] .............................. H03B 5/32; H03B 5/36
(52) U.S. Cl. .................. 331/158; 331/116 R; 331/175; 331/182; 331/183; 331/186
(58) Field of Search .............................. 331/109, 116 R, 331/116 FE, 117 R, 117 FE, 117 D, 158, 175, 182, 183, 185, 186

(56) References Cited

U.S. PATENT DOCUMENTS

| 4,208,639 | A |   | 6/1980  | Stickel |
|---|---|---|---|---|
| 4,360,789 | A |   | 11/1982 | Lewyn et al. |
| 4,479,259 | A |   | 10/1984 | Fenk |
| 4,551,642 | A |   | 11/1985 | Aizawa et al. |
| 4,571,558 | A |   | 2/1986  | Gay et al. ................... 331/105 |
| 4,646,033 | A |   | 2/1987  | Perkins .................. 331/116 R |
| 4,725,790 | A |   | 2/1988  | Addis et al. |
| 4,797,632 | A |   | 1/1989  | Guery |
| 5,347,237 | A |   | 9/1994  | Rokos |
| 5,740,213 | A | * | 4/1998  | Dreyer ...................... 375/374 |
| 5,748,040 | A | * | 5/1998  | Leung ........................ 330/253 |
| 5,815,044 | A |   | 9/1998  | Ogawa et al. .......... 331/117 R |
| 5,818,306 | A |   | 10/1998 | Lee et al. |
| 5,821,828 | A |   | 10/1998 | Dijkmans |
| 5,912,594 | A |   | 6/1999  | Burkhard |
| 5,953,173 | A | * | 9/1999  | Klaassen et al. .............. 360/66 |
| 6,018,261 | A |   | 1/2000  | Alford et al. |

FOREIGN PATENT DOCUMENTS

| EP | 0 515 182 | 5/1992  | ............ H03B/5/36 |
|---|---|---|---|
| EP | 0 601 217 | 11/1992 | ........... H03B/25/00 |
| EP | 0 978 945 | 7/1999  | ............ H03L/5/00 |
| EP | 1030439   | 8/2000  | |

* cited by examiner

*Primary Examiner*—David C. Mis
(74) *Attorney, Agent, or Firm*—Antonelli, Terry, Stout & Kraus, LLP

(57) ABSTRACT

In an electronic circuit supplied from supply terminals, a terminal in the circuit being biased to a voltage between the supply terminal voltages, connections from power supply terminals are made via current generator means.

The circuit is preferably an RF, balanced and/or oscillator circuit.

The current generator means are preferably controllable current generators, preferably controlled by an AGC, or a common mode or differential voltage control circuit.

Preferably, the controllable current generators comprise a FET or are substantially constituted by each one MOS-FET.

A balanced, common-base, low-voltage Pierce crystal oscillator with two transistors and four to six current generator means is disclosed.

17 Claims, 4 Drawing Sheets

ELECTRONIC CIRCUIT SUPPLIED WITH POWER VIA CURRENT GENERATOR MEANS

BACKGROUND OF THE INVENTION

The invention relates to an electronic circuit being supplied from differential voltage (e.g. positive and negative) power supply terminals, in which a terminal in the circuit is biased to a voltage in the range between the voltages of the power supply terminals.

The circuit of the invention is i.a. suitable for use in differential crystal oscillators or similar circuits.

Differential crystal oscillators are well known in the art, being supplied with power via resistors or inductors.

From U.S. Pat. No. 5,912,594 a Pierce oscillator is known, having a current source type biasing element, used as an emitter impedance. According to said patent, this element represents a high impedance, ideally a no-load impedance for high-frequency currents.

It is an object of the present invention to improve the general performance of circuits of the type mentioned at the outset, in particular of a low-voltage differential oscillator.

SUMMARY OF THE INVENTION

In a first aspect, the present invention provides an electronic circuit comprising first and second power supply terminals having different voltage potentials, a circuit node arranged to be biased to a voltage in the range between the voltages of said first and second power supply terminals by controllable current generator means, wherein the controllable current generator means is arranged to stabilise the voltage of said circuit node by using one or more control signal sources which form part of a closed loop in the electronic circuit.

Two kind of control signal sources are used to stabilise the voltage of the said circuit node; a control signal source where the control signal is derived from the signal to be controlled, e.g. by an AGC (Automatic Gain Control) circuit, and a reference control signal source, e.g. by a DC voltage source. In general, any control/feedback circuit uses both with the circuit configured so that the signal derived from the signal to be controlled is held at the same level as the reference signal. The control signal source is generally a circuit, and the AGC circuit is an example of one such circuit.

Preferably, the first and second power supply terminals respectively have positive and negative voltage potentials.

In an electronic circuit being supplied from positive and negative power supply terminals, a terminal in the circuit being biased to a voltage in the range between the voltages of said positive and negative power supply terminals, this object is met in that connections from said power supply terminals to the circuit are made through current generator means.

By this measure, said connections will attain a comparatively high impedance, seen from the circuit towards the supply lines, and thereby providing an improved isolation of the circuit against small signals from the supply lines (typically noise and stray signals), as well as large signals from the supply lines (deviations of the supply voltage, etc.).

Further, control of the working conditions of the circuit will be facilitated as the current generator means will readily permit biasing the circuit or part of it to a desired voltage between the voltages of the supply lines, the current generator means enabling the circuit to "float" freely between the voltages of the supply lines.

When controllable current sources or generators are used, the parameters of the circuit may advantageously be adapted to shifting working conditions by suitable control of the currents supplied by the current generators.

The electronic circuit may be a RF (radio frequency) circuit. The electronic circuit may be an oscillator circuit. In such a case, the circuit may be a crystal oscillator circuit. In such circuits, the isolation mentioned will be of particular importance. In RF circuits, said high impedances will facilitate an effective decoupling of the supply lines. In oscillator circuits, an improved isolation is in any case important in order to obtain as low a noise level on the oscillator output signal as possible.

In a particularly preferred embodiment, the circuit comprises a common-base, balanced Pierce crystal oscillator comprising two transistors with their bases connected to a fixed DC bias source, the collectors of the transistors connected to each their output terminal of the circuit and to each their terminal of a quartz crystal, capacitive voltage divider feedback paths leading from each collector to an associated transistor emitter.

Preferably, the electronic circuit is a balanced circuit comprising two substantially identical or mirrored sub-circuits. In another preferred embodiment, the circuit may be a balanced circuit comprising two substantially identical or mirrored sub-circuits and wherein the circuit comprises a balanced Pierce oscillator.

When use is made of the invention in a balanced circuit, a synergetic effect is obtained in that the high impedances of the current generator means tend to enhance the isolation of the circuit from common mode disturbances which is generally already present to a substantial degree in a balanced circuit.

The electronic circuit may comprise two or more controllable current generator means and a corresponding number of circuit nodes, wherein two or more of the current generator means are arranged to utilise the same control signal source to stabilise the voltage in the corresponding circuit node. In this case, particular advantages are obtained in that a circuit parameter for the balanced circuit as a whole will be controllable from one and the same control input terminal. In this way, a particularly efficient and exact control of said common mode voltage is obtained.

In this case, said control signal source may form part of a closed loop stabilising the differential voltage of the nodes connecting said two controllable current generators to said electronic circuit. In this way, a particularly efficient and exact control of said differential voltage is obtained, which according to the invention may advantageously be combined with the aforementioned control of the corresponding common mode voltage.

The control signal source is generally a circuit. The control signal source may be an AGC circuit. In this way, a particularly simple and component effective AGC is had for a differential electronic circuit, in situations where e.g. the gain of the circuit is depending on the current supplied or drained by the current generator means.

In one specific embodiment, the electronic circuit may comprise two or more controllable current generator means and a corresponding number of circuit nodes, wherein two or more of the current generator means are arranged to utilise the same control signal source to stabilise the voltage in the corresponding circuit node and wherein said same control signal source forms part of a closed loop stabilising the common mode voltage of the nodes connecting said two controllable current generators to said electronic circuit.

In one embodiment, the electronic circuit may comprise two or more controllable current generator means and a corresponding number of circuit nodes, and the outputs of the controllable current generator means may each be connected to different nodes, and these nodes may be connected to one another by one or more active/passive components. The active component may be a transistor or other such component, and the passive component may be a resistor or other such component.

In this case, the circuit connected between the outputs of the controllable current generator means will have a comparatively large impedance with respect to supply terminals.

In another specific embodiment, the electronic circuit may comprise a common-base, balanced Pierce crystal oscillator comprising two transistors with their bases connected to a fixed DC bias source, the collectors of the transistors connected to each their output terminal of the circuit and to each their terminal of a quartz crystal, capacitive voltage divider feedback paths leading from each collector to an associated transistor emitter, characterised in that:

current is supplied from a first power supply terminal to the transistor collector terminals via controllable current generators controlled from a servo loop circuit having the common mode voltage of said transistor collector terminals as the controlled variable;

current is added to the currents supplied from the first power supply terminal to said collector terminals by controllable current generators controlled from differential outputs of a differential amplifier in a servo loop circuit having the differential voltage of said transistor collector terminals as the controlled variable; and current is drained from the transistor emitters to a second power supply terminal via controllable current generators controlled from an AGC circuit controlling the output voltage and/or the gain of the crystal oscillator.

In this circuit, current is according to the invention supplied from a first power supply terminal to the transistor collector terminals via controllable current generators controlled from a servo loop circuit having the common mode voltage of said transistor collector terminals as the controlled variable; current is added to the currents supplied from the first power supply terminal to said collector terminals by controllable current generators controlled from differential outputs of a differential amplifier in a servo loop circuit having the differential voltage of said transistor collector terminals as the controlled variable; and current is drained from the transistor emitters to a second power supply terminal via controllable current generators controlled from an AGC circuit controlling the output voltage and/or the gain of the crystal oscillator.

This circuit combines the advantages of the invention mentioned above, the invention thereby providing a balanced Pierce type oscillator of superior performance, thereby contributing i.a. to: enhanced isolation from supply lines, improved control of crystal oscillating mode, independent control or servo control of differential and common mode working points, simple but effective AGC means, and use of supply voltages down to 1.8 V.

In such a case, the controllable current generators may comprise, as a major functional element, a FET (field effect transistor). A FET considered as a component has as intrinsic characteristics many of the features needed in a controllable current generator. Thus, a considerable saving in component count may be obtained by utilising in the circuit of the invention the rather linear interdependence between gate voltage and drain current of the FET.

In other embodiment, the controllable current generators may comprise, as a major functional element, a FET (field effect transistor) and wherein controllable current generators are substantially constituted by each one MOS-FET (metal oxide semiconductor field effect transistor), the source and drain of said FET constituting the supply terminals of the respective current generator, and the gate of said FET constituting the control input terminal of said respective current generator.

This embodiment will imply an ultimately simple controllable current generator, having quite satisfactory performance for the purpose of this invention.

BRIEF DESCRIPTION OF THE DRAWINGS

Below, the invention will be explained in more detail by means of embodiment examples and with reference to the drawings, in which FIG. 1 schematically shows a differential crystal oscillator with power supply via current generator means, according to the invention.

The same reference designations designates the same or similar elements in all the figures.

DETAILED DESCRIPTION OF THE INVENTION

Figure 1:
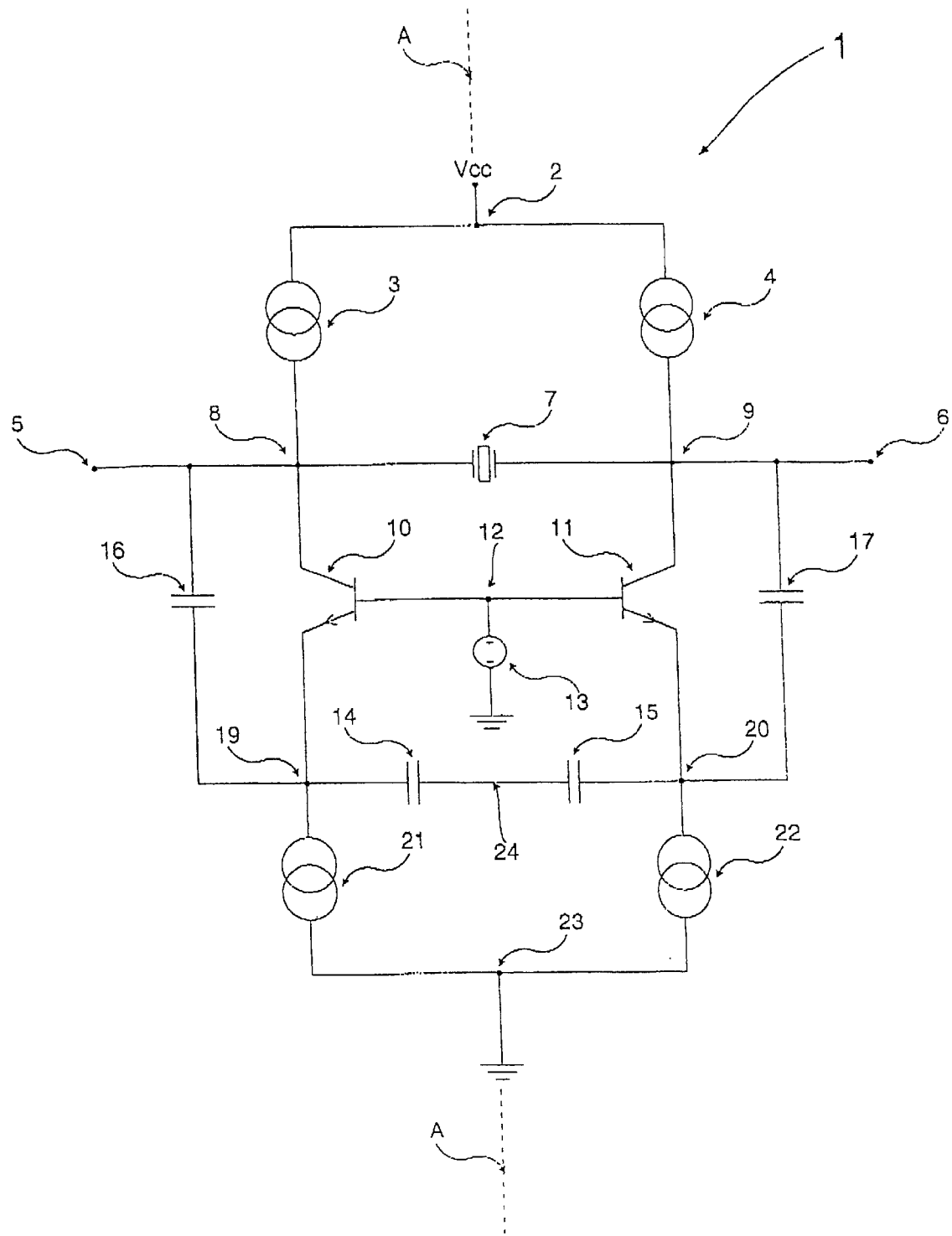

In FIG. 1, a differential mode oscillator 1 is shown. As apparent from FIG. 1, the circuit is symmetric with respect to a vertical centre-line A–A.

Supply current is fed from a power supply terminal 2 (positive, or Vcc) via current generator means 3–4 having a high small-signal and large-signal impedance to the collector terminals 8–9 of two transistors 10–11, two output terminals 5–6 as well being connected to the collector terminals 8–9, respectively. Preferably, output signals are taken from the output terminals via suitable buffer circuits, these preferably being differential buffer circuits.

In operation, the two outputs 5–6 will operate in phase opposition, and thus the voltage across the crystal 7, which is connected between the collector terminals 8–9, will be an AC voltage with ideally no DC component.

The base terminals of the two transistors 10–11 are connected together at a node 12 which is biased by a DC bias generator 13. The node 12 represents a virtual ground terminal owing to the symmetry of the oscillator circuit; the DC generator may according to the invention have a low impedance at low frequencies, thereby further qualifying the node 12 as a virtual ground terminal.

At higher frequencies, the DC generator 13 may according to the invention have a substantially higher impedance, thereby tending to isolating the oscillator circuit from ground-induced noise.

Feedback is taken from the collector terminals 8–9 to the emitter terminals 19–20 of the transistors 10–11 via capacitive voltage dividers formed by capacitors 16, 14 and 17, 15, respectively. In this respect, the node 24 between the two capacitors 14–15 represents a virtual ground terminal as well, due to the symmetric operation of the oscillator circuit 1, the two capacitors 14–15 having equal values and the two capacitors 16–17 having equal values.

The supply current is returned to a negative or ground terminal 23 from the emitter terminals 19–20 of the two transistors 10–11 via current generator means 21–22 having high small-signal and large-signal impedances.

As every node or terminal along the symmetry line A–A is in fact a virtual ground terminal, the oscillator circuit 1 can be divided along this line A–A into two subcircuits. The right subcircuit 30 is shown in FIG. 2.

The virtual ground terminals along the line of symmetry A–A are: the Vcc terminal 2; an imaginary "centre tap terminal" 31 of the crystal 7; the base terminal 12; the node 24 between the capacitors 14–15; and the ground terminal 23. In FIG. 2, the virtual ground terminals 31, 12 and 24 are shown connected virtually to ground 32 by dashed lines.

Figure 2:
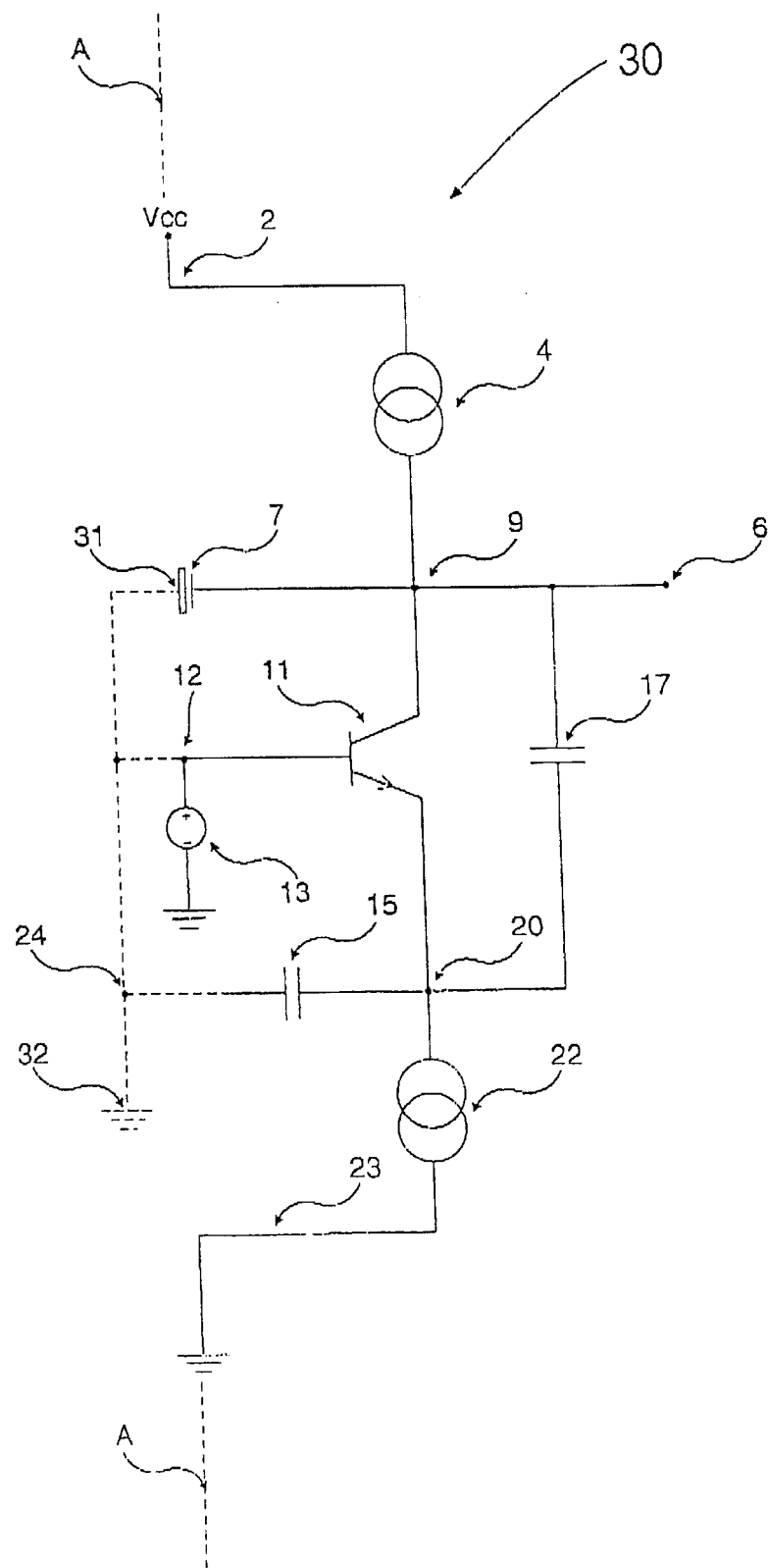
FIG. 2 shows the right half of the differential oscillator in FIG. 1.

It is now readily seen from FIG. 2 that the right subcircuit 30 constitutes a common-base Pierce type oscillator. Thus, the circuit 1 in FIG. 1 may be designated a common base Pierce type differential mode (or: balanced) oscillator.

The use of balanced circuits is generally preferable in RF applications, mainly in order to reduce unwanted radiation, but also in order to e.g. reduce loop currents in ground loops. In general, as high a degree of symmetry as possible is to be preferred in balanced RF circuits, for the same reasons, and especially in order to reduce unwanted radiation.

The use of balanced RF circuits is also preferable in battery powered equipment such as e.g. a mobile telephone, because it permits handling of a higher RF power level in a circuit powered by a given battery voltage.

Further, the use of balanced circuits is preferable in integrated circuits, these most often being made on monolithic semiconductor substrates. The substrate thus being more or less conductive, it will permit stray signals to propagate through the circuit, which in the case of RF signals may be more detrimental to the functioning of the circuit than in the case of DC or logic circuits. The use of balanced circuits on the semiconductor chip will tend to minimise this effect, the balanced signals tending to absorb or balance out stray currents locally within the circuit or within a sub-circuit.

Thus, the oscillator circuit of FIG. 1 will be suitable for use in e.g. a mobile telephone, where circuits are most often integrated on semiconductor chips, and where it is of prime importance to obtain high RF power levels from low battery voltage and to avoid unwanted RF radiation.

The use of current generator means 3–4 and 21–22 according to the invention isolates the oscillator from the Vcc and ground terminals 2, 23 because of the high impedances of the current generator means 3–4 and 21–22.

Hereby, noise, interference and common mode disturbances on the supply and ground rails will be attenuated effectively before they reach the oscillator circuit, to a degree even higher than associated with differential circuits of the prior art.

In a circuit powered by a low voltage in, say, a portable, battery-powered piece of equipment such as e.g. a mobile telephone, resistors typically having a resistance in the order of 2 kOhm are often used in place of the current generator means 3–4, 21–22 of the invention.

Current generator means 3–4 and 21–22 having output impedances in the order of 100 kOhm are easily realised with a quite low component count. According to the invention, this will provide substantially better isolation and lower DC and AC losses by introducing such high impedances between the circuit and the power supply terminals. The lower AC losses will in turn provide for reduced power consumption as well as reduced noise.

In addition, a circuit fed by such current generator means can be operated from very low supply voltages, as the necessary voltage drop across current generator means according to the invention can be quite low, the current generator means still providing satisfactory performance.

Figure 3:
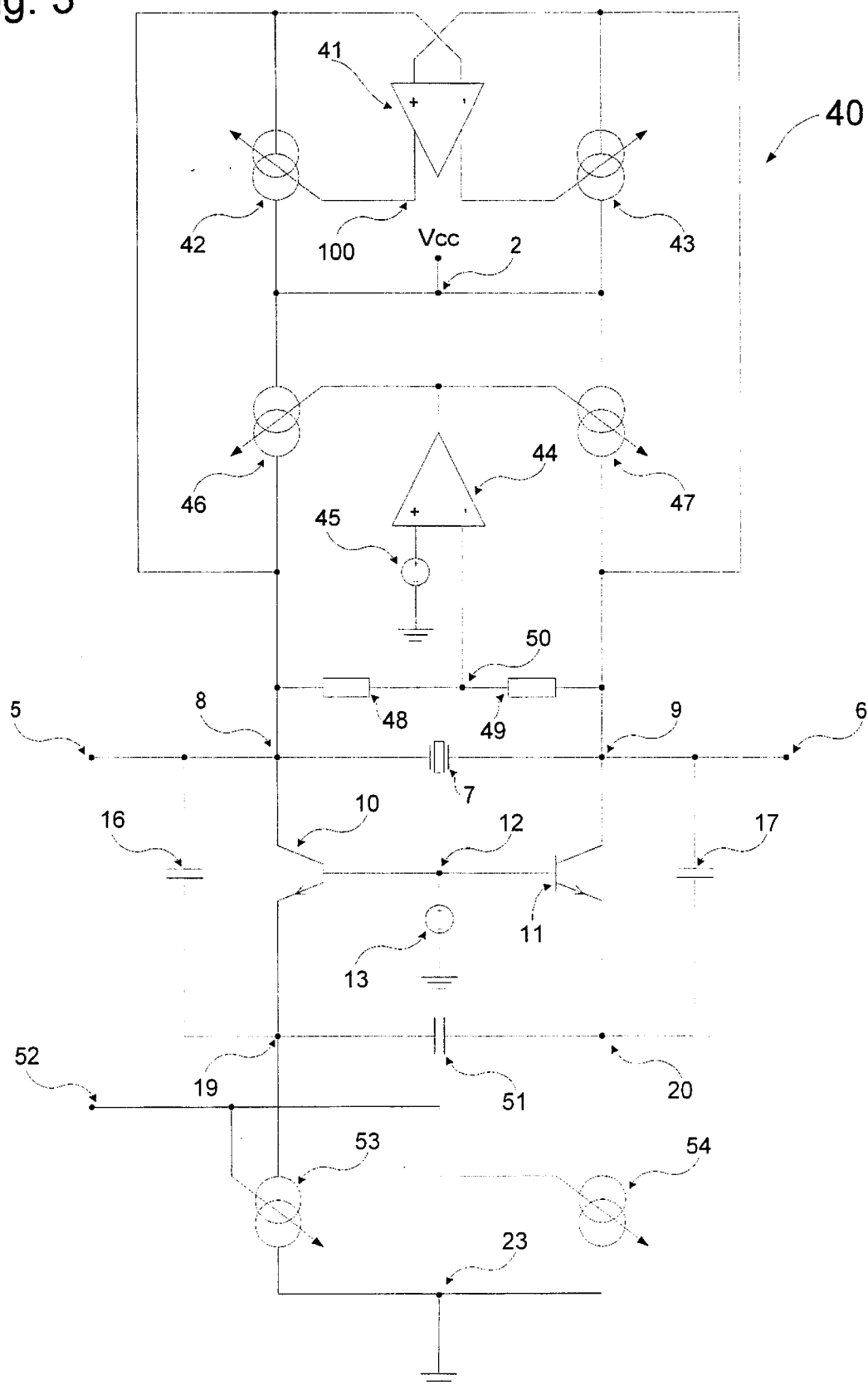
FIG. 3 shows the circuit of FIG. 1, completed with circuits according to the invention for control of the current generator means.

The embodiment example in FIG. 3 is in fact designed for a supply voltage Vcc of 2.7 V, and embodiments according to the invention for 1.8 to 2.2 V are obtainable with relative ease.

An intended use of the circuit in FIG. 3 would be a master oscillator in e.g. a mobile telephone. The master oscillation frequency would preferably be of magnitude 10–100 MHz, and further frequencies needed in the mobile telephone would preferably be synthesised from the master frequency.

According to the invention, the current generator means are separate for each of the halves of a balanced oscillator circuit. This is the situation illustrated in the drawings, as the current generator means 3 is separate from the current generator means 4, and the current generator means 21 is separate from the current generator means 22.

In an oscillator circuit 40 in FIG. 3, control circuitry according to the invention has been added to the circuit of FIG. 1. Said circuitry comprises first, second and third control circuits in the embodiment shown in FIG. 3.

A first control circuit comprises two resistors 48–49; a voltage source 45; a differential amplifier 44; and two controllable current generators 46–47 to constitute the current generator means 3–4 (FIG. 1).

In the first control circuit, the two resistors 48–49 establish a voltage on their common node 50, said voltage corresponding to the common mode voltage of the collector terminals 8–9. The difference between this collector terminal common mode voltage and a pre-set reference bias voltage provided by the voltage generator 45 is amplified by the differential amplifier 44, the output of which is connected to control input terminals of the current generators 46–47.

Thus, from the common mode voltage on the terminals 8–9, a closed loop leads to the negative input of the amplifier 44, through the amplifier 44 and via the control inputs of the current generators 46–47 to the terminals 8–9, and from there via the resistors 48–49 to the node 50 having the potential of the common mode voltage. The first control circuit thus forms a servo loop for controlling the common mode voltage on the collector terminals 8–9.

By providing a certain voltage on the positive input of the amplifier 44, from the voltage generator 45 or by any other means, a desired, corresponding common mode voltage can thus be had on the collector terminals 8–9.

The voltages corresponding to the shown generators 13 and 45 may derived from one common source, thereby reducing the number of required connections from the power supply to the oscillator circuit by one, and hence reducing the risk of inducing drift and noise into the oscillator circuit from the power supply.

As the amplifier 44 can easily be made with a very high input impedance, e.g. by use of internal feed-back, the resistors 48–49 can be made as large as desired within practical limits, thereby not impairing the functioning of the oscillator circuit 40, or implicating any significant AC or DC losses.

A second control circuit comprises a control input 52; and two controllable current generators 53–54 to constitute the current generator means 21–22 (FIG. 1).

By applying a control voltage on the control input terminal 52, the two current generators 53–54 can be controlled to supply a desired common mode current to (or drain a desired common mode current from) the emitter terminals 19–20 of the oscillator circuit 40.

This will control the operating DC current of the transistors and thereby their gain hFE as well as their working points.

Thus, a desired working point of the transistors can be chosen where the circuit is operating at desired linear conditions. Tests have shown that operating conditions can be reached which will enable linear operation of the oscillator circuit 40 under normal oscillation.

This entails the advantage that coupling of common mode noise and disturbances to the differential oscillation and folding of low frequency noise to the oscillation frequency is reduced by minimising the non-linearities. Also, current consumption is minimised, reducing both noise and power consumption.

In addition, the gain hFE of the transistors can be adjusted or controlled while the circuit is operating, thereby providing a simple but effective AGC means.

According to the invention such an effective AGC is preferably utilised for controlling the mode of oscillation of the quartz crystal 7.

In general, one of the possible modes of oscillation of the crystal is a wanted mode. The crystal however having several other mechanical modes of oscillation in the neighbourhood of the frequency of the wanted mode, oscillation in these modes will disturb or "contaminate" the signal of the wanted oscillation mode. Even if the crystal is not actually oscillating in an unwanted mode, such a mode may be disturbing the signal of the wanted mode.

However, the unwanted modes of oscillating generally demands more gain in the oscillator circuit than the wanted mode. Therefore, if the gain can be controlled with an adequate precision, e.g. by means of the AGC means described, it will be possible to operate an oscillator circuit 40 with a gain just sufficient to maintain the wanted mode oscillation, thereby preventing effectively the unwanted modes to disturb the oscillation waveform.

Besides, such effective control of the gain of the oscillator is preferably utilised in a closed AGC loop comparing the amplitude at the oscillator output (or a buffer output) with a reference and controlling the gain via control input 52 to obtain a desired output level.

Hereby, ample gain is provided at start-up of the oscillator, where amplitude is low, for starting the oscillation quickly and at the same time limiting the gain to the just sufficient level mentioned when the oscillator is operating.

Hereby, the invention provides an efficient means for suppressing spurious oscillation modes in a balanced oscillator circuit.

A third control circuit in the oscillator circuit 40 in FIG. 3 comprises a differential amplifier 41 with differential outputs; and two controllable current generators 42–43.

The differential outputs of the differential amplifier 41 are coupled to each their control input of the current generators 42–43. Hereby, a change of the amplifier output signal will tend to increase the output current of the one current generator and to reduce the output current of the other current generator.

The current generators 42–43 are coupled in parallel with the current generators 46–47, and thus add current to the currents generated by the current generators 46–47.

As the voltage difference at the inputs of the differential amplifier 41 changes, the third control circuit will therefore increase the collector bias current to the one transistor and reduce the collector bias current to the other transistor in the oscillator circuit 40.

The voltages of the collector terminals 8–9 are however fed back to the differential inputs of the differential amplifier 41, and therefore the third control circuit will stabilise the differential voltage of the collector terminals 8–9 to a desired value; in the embodiment shown in FIG. 3, said desired value is zero volts.

The use of the third control circuit according to the invention will compensate for mismatch between the left and the right half of the oscillator circuit 40, and will avoid any significant DC voltage across the crystal 7.

In addition, said third control circuit is according to the invention preferably adapted to give a strong feedback at lower frequencies. This will provide the advantage of significantly reducing differential 1/f-noise without affecting the oscillation, which in turn will reduce the risk of such 1/f-noise being folded to the oscillation frequency due to remaining non-linearities in the oscillator circuit.

Instead of using for each collector node (8) two current generators (42, 46) in parallel having each their control input, a single current generator may according to the invention be used, either having two control inputs or having the two control signals (e.g. 100), from the amplifiers 41 and 44 respectively, added in a suitable adder circuit before feeding them to the control input of the single current generator.

By implementing six current generator means 3–4, 21–22 according to the invention, it has thus been made possible to control the bias conditions of a differential oscillator circuit (40) in a particularly efficient and rather simple way. The common mode and differential potentials of the collector terminals (in casu, the terminals having the largest voltage swing) can be controlled independently of each other, and the operating DC current of the transistors (and thereby their gain (hFE)) can be controlled, preferably by an AGC circuit, stabilising the oscillator circuit to a desired working point where the circuit is operating at desired linear conditions.

According to the invention, the current generators 42–43, 46–47 and 53–54 which constitute the current generator means 3–4 and 21–22, are preferably comprising single FETs (field effect transistors), the current path extending from source to drain (or vice versa) and the control input being the gate terminal. Thus, a certain control voltage on the gate terminal will permit a desired DC current flow through the source-drain path.

By this provision, the current generators are established in a particularly simple and cost-effective way, most suitable for implementation in an integrated circuit.

Figure 4:
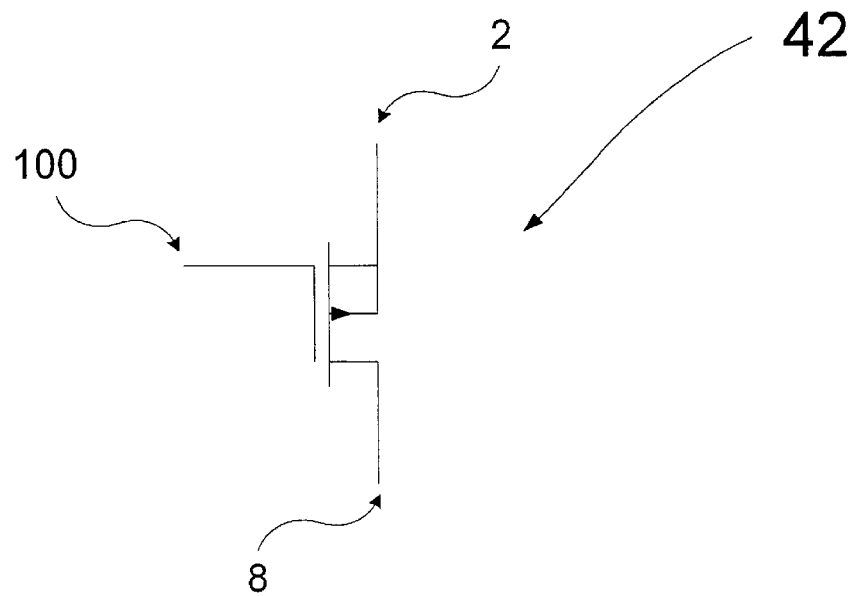
FIG. 4A shows the details of the current generator means 42 in FIG. 3.
FIG. 4B shows the details of the current generator means 53 in FIG. 3.
Figure 4:
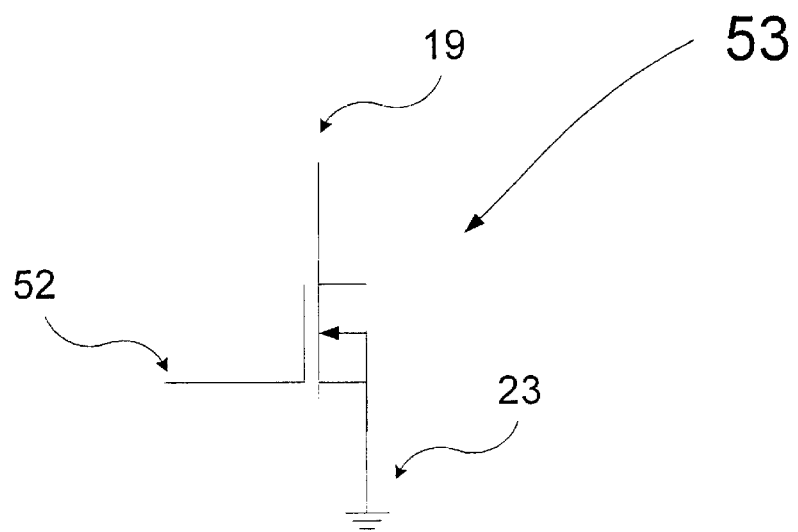

It is particularly preferred that the current generators 42–43, 46–47 and 53–54 are constituted by each one single MOS-FET (metal oxide semiconductor field effect transistor) as shown in FIGS. 4A and 4B. The source and drain of such a MOS-FET will then constitute the supply terminals of the respective current generator, and the gate of the MOS-FET will constitute the control input terminal of the current generator.

In current generators of this type, very low working voltages can be obtained, providing for using the circuit at lower Vcc voltage than circuits of the prior art being supplied with power via resistors. As mentioned above, embodiments of the circuit according to the invention designed for supply voltages of 1.8 to 2.2 V are obtainable.

In the circuit 40 in FIG. 3, the two capacitors 14–15 in FIG. 1 have been replaced by one single capacitor 51. This will be advantageous if the fact that the two capacitors 14–15 in FIG. 1 each have one of their terminals (in casu the node 24) connected to ground or virtual ground (or in fact any other potential), is not to be utilised.

Even if the invention has been explained above with particular reference to balanced oscillator circuits, nothing will prevent the invention from being used in other types of circuits, not necessarily being balanced or RF circuits.

What is claimed is:

1. An electronic circuit comprising
   first and second power supply terminals having different voltage potentials,
   a circuit node arranged to be biased to a voltage in the range between the voltages of said first and second power supply terminals by controllable current generator means, wherein the controllable current generator means is arranged to stabilise the voltage of said circuit node by using one or more control signal sources which form part of a closed loop in the electronic circuit.

2. An electronic circuit as claimed in claim 1, wherein the first and second power supply terminals respectively have positive and negative voltage potentials.

3. An electronic circuit according to claim 1, wherein the circuit is an RF (radio frequency) circuit.

4. An electronic circuit according to claim 1, wherein the circuit is an oscillator circuit.

5. An electronic circuit according to claim 1, wherein the circuit is a radio frequency crystal oscillator circuit.

6. An electronic circuit according to claim 1, wherein the circuit is a balanced circuit comprising two substantially identical or mirrored sub-circuits.

7. An electronic circuit according to claim 1, wherein the circuit is a balanced circuit comprising two substantially identical or mirrored sub-circuits and wherein the circuit comprises a balanced Pierce oscillator.

8. An electronic circuit according to claim 1, comprising two or more controllable current generator means and a corresponding number of circuit nodes, wherein two or more of the current generator means are arranged to utilise the same control signal source to stabilise the voltage in the corresponding circuit node.

9. An electronic circuit according to claim 1, comprising two or more controllable current generator means and a corresponding number of circuit nodes, wherein two or more of the current generator means are arranged to utilise the same control signal source to stabilise the voltage in the corresponding circuit node and wherein said control signal source forms part of a closed loop stabilising the differential voltage of the nodes connecting said two controllable current generators to said electronic circuit.

10. An electronic circuit according to claim 1, wherein said control signal source is an AGC (automatic gain control) circuit.

11. An electronic circuit according to claim 1, comprising two or more controllable current generator means and a corresponding number of circuit nodes, wherein two or more of the current generator means are arranged to utilise the same control signal source to stabilise the voltage in the corresponding circuit node and wherein said same control signal source forms part of a closed loop stabilising the common mode voltage of the nodes connecting said two controllable current generators to said electronic circuit.

12. An electronic circuit according to claim 1, wherein the electronic circuit comprises two or more controllable current generator means and a corresponding number of circuit nodes, and wherein the outputs of the controllable current generator means are each connected to a different node, and these nodes are connected to one another by one or more active/passive components.

13. An electronic circuit according to claim 1, wherein the electronic circuit comprises two or more controllable current generator means and a corresponding number of circuit nodes, and wherein the outputs of the controllable current generator means are each connected to a different node, and these nodes are connected to one another by one or more active/passive components and wherein the active component is a transistor.

14. An electronic circuit according to claim 1, wherein the electronic circuit comprises two or more controllable current generator means and a corresponding number of circuit nodes, and wherein the outputs of the controllable current generator means are each connected to a different node, and these nodes are connected to one another by one or more active/passive components and wherein the passive component is a resistor.

15. An electronic circuit according to claim 1, the circuit comprising a common-base, balanced Pierce crystal oscillator comprising two transistors with their bases connected to a fixed DC bias source, the collectors of the transistors connected to each their output terminal of the circuit and to each their terminal of a quartz crystal, capacitive voltage divider feedback paths leading from each collector to an associated transistor emitter, characterised in that:
   current is supplied from a first power supply terminal to the transistor collector terminals via controllable current generators controlled from a servo loop circuit having the common mode voltage of said transistor collector terminals as the controlled variable;
   current is added to the currents supplied from the first power supply terminal to said collector terminals by controllable current generators controlled from differential outputs of a differential amplifier in a servo loop circuit having the differential voltage of said transistor collector terminals as the controlled variable; and
   current is drained from the transistor emitters to a second power supply terminal via controllable current generators controlled from an AGC circuit controlling the output voltage and/or the gain of the crystal oscillator.

16. An electronic circuit according to claim 1, wherein controllable current generators comprise as a major functional element a FET (field effect transistor).

17. An electronic circuit according to claim 1, wherein controllable current generators comprise as a major functional element a FET (field effect transistor) and wherein controllable current generators are substantially constituted by each one MOS-FET (metal oxide semiconductor field effect transistor), the source and drain of said FET constituting the supply terminals of the respective current generator, and the gate of said FET constituting the control input terminal of said respective current generator.

* * * * *